United States Patent
Kao et al.

(10) Patent No.: US 9,081,241 B2
(45) Date of Patent: Jul. 14, 2015

(54) PIXEL STRUCTURE AND MANUFACTURING METHOD THEREOF

(75) Inventors: Ling-Chih Kao, New Taipei (TW);
Chu-Hung Tsai, Kaohsiung (TW);
Kun-Tsai Huang, Tainan (TW)

(73) Assignee: HANNSTAR DISPLAY CORPORATION, New Taipei (TW)

( * ) Notice: Subject to any disclaimer, the term of this patent is extended or adjusted under 35 U.S.C. 154(b) by 555 days.

(21) Appl. No.: 13/355,481

(22) Filed: Jan. 20, 2012

(65) Prior Publication Data
US 2013/0112983 A1 May 9, 2013

(30) Foreign Application Priority Data
Nov. 7, 2011 (TW) .............................. 100140628 A

(51) Int. Cl.
| | | |
|---|---|---|
| H01L 29/12 | (2006.01) | |
| H01L 29/786 | (2006.01) | |
| H01L 21/00 | (2006.01) | |
| G02F 1/1343 | (2006.01) | |
| H01L 27/12 | (2006.01) | |
| G02F 1/1362 | (2006.01) | |

(52) U.S. Cl.
CPC .... *G02F 1/134363* (2013.01); *G02F 1/136213* (2013.01); *H01L 27/1255* (2013.01); *H01L 27/1259* (2013.01); *G02F 2201/40* (2013.01)

(58) Field of Classification Search
CPC ..................... G02F 1/134363; H01L 27/1259
USPC ................................................ 257/71; 438/22
See application file for complete search history.

(56) References Cited

U.S. PATENT DOCUMENTS

| | | | | |
|---|---|---|---|---|
| 6,509,939 | B1* | 1/2003 | Lee et al. .......................... | 349/39 |
| 7,576,823 | B2 | 8/2009 | Kang et al. | |
| 2001/0050745 | A1 | 12/2001 | Liu et al. | |
| 2005/0078259 | A1* | 4/2005 | Ahn et al. ...................... | 349/141 |
| 2006/0139549 | A1* | 6/2006 | Ahn et al. ...................... | 349/141 |
| 2006/0145990 | A1 | 7/2006 | Kim et al. | |
| 2009/0141228 | A1* | 6/2009 | Shih et al. ...................... | 349/139 |
| 2011/0122330 | A1 | 5/2011 | Tae et al. | |
| 2011/0316809 | A1* | 12/2011 | Kim et al. ...................... | 345/174 |
| 2012/0104392 | A1* | 5/2012 | Son et al. ......................... | 257/59 |
| 2012/0161137 | A1* | 6/2012 | Lee .................................. | 257/59 |

FOREIGN PATENT DOCUMENTS

| | | |
|---|---|---|
| CN | 1619393 A | 5/2005 |
| CN | 101470308 A | 7/2009 |

* cited by examiner

*Primary Examiner* — Matthew Landau
*Assistant Examiner* — Igwe U Anya
(74) *Attorney, Agent, or Firm* — Cheng-Ju Chiang

(57) ABSTRACT

A pixel structure and a method for manufacturing the same are disclosed. The pixel structure of the present invention is a pixel structure implemented by combining an in-plane switching (IPS) technique and a fringe field switching (FFS) technique. In each pixel structure, two transparent conductive layers are utilized to form a storage capacitor (Cst) such that the capacitance of the storage capacitor can be increased without decreasing an aperture ratio of a display panel, and thereby a feedthrough voltage can be reduced so as to prevent a screen from blinking.

19 Claims, 16 Drawing Sheets

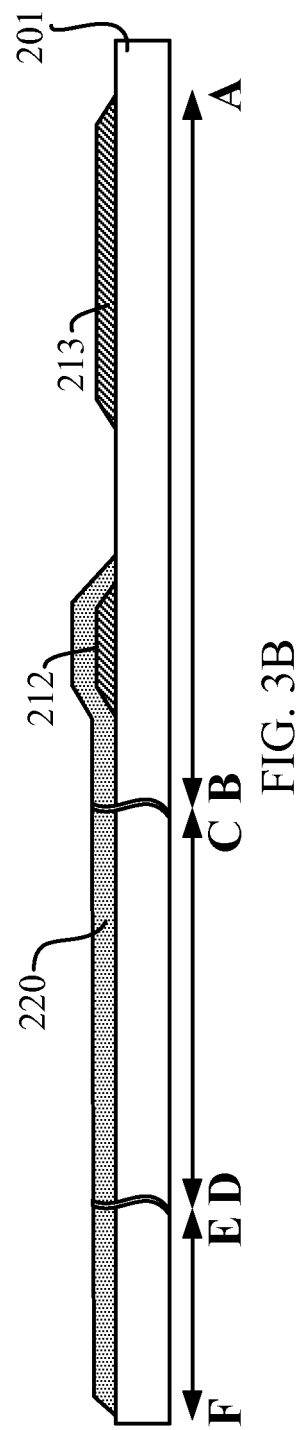

PIXEL STRUCTURE AND MANUFACTURING METHOD THEREOF

TECHNICAL FIELD OF THE INVENTION

The present invention relates to a pixel structure of a liquid crystal display and a method for manufacturing the same, and more particularly, to a pixel structure and a manufacturing method thereof for improving an aperture ratio of a display panel.

BACKGROUND OF THE INVENTION

In a pixel structure of a liquid crystal display, it generally has to dispose a storage capacitor for storing a pixel data for a period of time till updated. The storage capacitor is usually formed by two metal layers. Since the two metal layers are not transparent, the arrangement of the storage capacitor is inevitable to sacrifice an aperture ratio of a display panel such that the aperture ratio is decreased.

FIG. 1 is top view of a conventional pixel structure. The pixel structure shown in FIG. 1 is a pixel structure of an in plane switching (IPS) structure. The pixel structure is formed by interlacing a gate line 111 and a data line 151. The pixel structure comprises a thin-film transistor structure 19, a pixel electrode 171, a common electrode 181, and a storage capacitor 10. The thin-film transistor structure 19 comprises a gate electrode 113, a source electrode 152, and a drain electrode 153. The gate electrode 113 of the thin-film transistor structure 19 is electrically connected to the gate line 111. The source electrode 152 is electrically connected to the data line 151. The pixel electrode 171 is electrically connected to the drain electrode 153 of the thin-film transistor structure 19 via a contact hole 161. The common electrode 181 is electrically connected to the common line 112 via another contact hole (not shown). The pixel electrode 171 and the common electrode 181 are located at the same layer, and this is the electrode arrangement of the IPS structure. The electric field formed therebetween can make liquid crystal molecules twisted.

The storage capacitor 10 comprises a bottom electrode 11 and a top electrode 15. The bottom electrode 11 and the top electrode 15 have an insulating layer (not shown) disposed therebetween. The bottom electrode 11 is formed by extending the common line 112 upward and downward. The top electrode 15 is extended from the drain electrode 153 to a region above the bottom electrode 11. The bottom electrode 11 and the top electrode 15 of the storage capacitor 10 both are opaque metal layers. As described above, the arrangement of the storage capacitor 10 will decrease the aperture ratio of the display panel.

In another aspect, it has to persist with a certain amount of capacitance of the storage capacitor when designing a pixel structure. If the storage capacitor is too small, it will cause a large feedthrough voltage such that a flicker may be occurred on a screen or the screen may be blinking. In the conventional pixel structure, increasing the storage capacitor is inevitable to increase the areas of the top electrode and the bottom electrode. This will reduce the aperture ratio and affect the quality of the display panel as well.

Therefore, how to develop a pixel structure and persist with a certain amount of capacitance of the storage capacitor without decreasing the aperture ratio or further, improving the aperture ratio, is an importance issue in this industrial field.

SUMMARY OF THE INVENTION

An objective of the present invention is to provide a pixel structure and a method for manufacturing the same, for increasing a storage capacitor to reduce a feedthrough voltage without decreasing an aperture ratio of a display panel so as to prevent a screen from blinking.

Another objective of the present invention is to provide a pixel structure and a method for manufacturing the same, for implementing a pixel structure by combining an IPS technique and a FFS technique.

To achieve the above objectives, the present invention provides a method for manufacturing a pixel structure, comprising steps of: forming a patterned first metal layer on a substrate, the patterned first metal layer comprising a common line and a gate electrode; forming a patterned first transparent conductive layer, of which a part covers the common line for electrically connecting thereto; forming a first insulating layer to cover the patterned first metal layer and the patterned first transparent conductive layer; forming a patterned semiconductive layer on the first insulating layer above the gate electrode; forming a patterned second metal layer, the patterned second metal layer comprising a source electrode and a drain electrode; forming a second insulating layer; patterning the first insulating layer and the second insulating layer to form a first contact hole and a second contact hole; and forming a patterned second transparent conductive layer which comprises a pixel electrode and a common electrode.

The present invention further provides a pixel structure, which is defined by a gate line and a data line, the pixel structure comprises: a common line disposed on a substrate; a patterned first transparent conductive layer electrically connected to the common line, the patterned first transparent conductive layer has a first common electrode; a patterned second transparent conductive layer located above the patterned first transparent conductive layer, the patterned second transparent conductive layer has a pixel electrode and a second common electrode; at least an insulating layer disposed between the patterned first transparent conductive layer and the patterned second transparent conductive layer; a thin-film transistor structure disposed on the substrate and comprising a gate electrode, a source electrode, and a drain electrode; wherein the second common electrode is electrically connected to the first common electrode, and the pixel electrode and the first common electrode forms a storage capacitor.

To prevent a screen from blinking, the conventional skill needs to increase the areas occupied by two metal layers to obtain a larger storage capacitor so as to reduce a feedthrough voltage. However, this approach will decrease an aperture ratio of a display panel. The storage capacitor of the pixel structure of the present invention is mainly formed by two transparent conductive layers. In this manner, the capacitance of the storage capacitor can be increased without reducing the aperture ratio. In the present invention, the feedthrough voltage will be decreased due to the increased storage capacitor, and thereby reducing the probability of screen blinking. In another aspect, the present invention pertains to a pixel structure combing an IPS technique and a FFS technique. The arrangement of the pixel electrode and the second common electrode is similar to that in an IPS structure, and the arrangement of the pixel electrode and the first common electrode is similar to that in a FFS structure.

BRIEF DESCRIPTION OF THE DRAWINGS

FIG. 3B is a cross-sectional view taken along A-B, C-D, and E-F of FIG. 3A.

DETAILED DESCRIPTION OF THE INVENTION

The present invention pertains to a liquid crystal display which comprises a plurality of pixel structures. The present invention is to utilize two transparent conductive layers to form a storage capacitor (Cst) in each pixel structure. The pixel structure of the present invention is a pixel structure implemented by combining an in-plane switching (IPS) technique and a fringe field switching (FFS) technique. The pixel structure and a method for manufacturing the same will be detailedly described below.

The present invention discloses a pixel structure and a manufacturing method thereof. The pixel structure of the present invention is shown in FIG. 7A and FIG. 7B, in which FIG. 7A is a top view of the pixel structure of the present invention and FIG. 7B is a cross-sectional view of the pixel structure of the present invention. The method for manufacturing the pixel structure disclosed in the present invention is referred to FIG. 2 to FIG. 7, in which cross-sectional views are taken along A-B, C-D, and E-F.

Figure 2A:
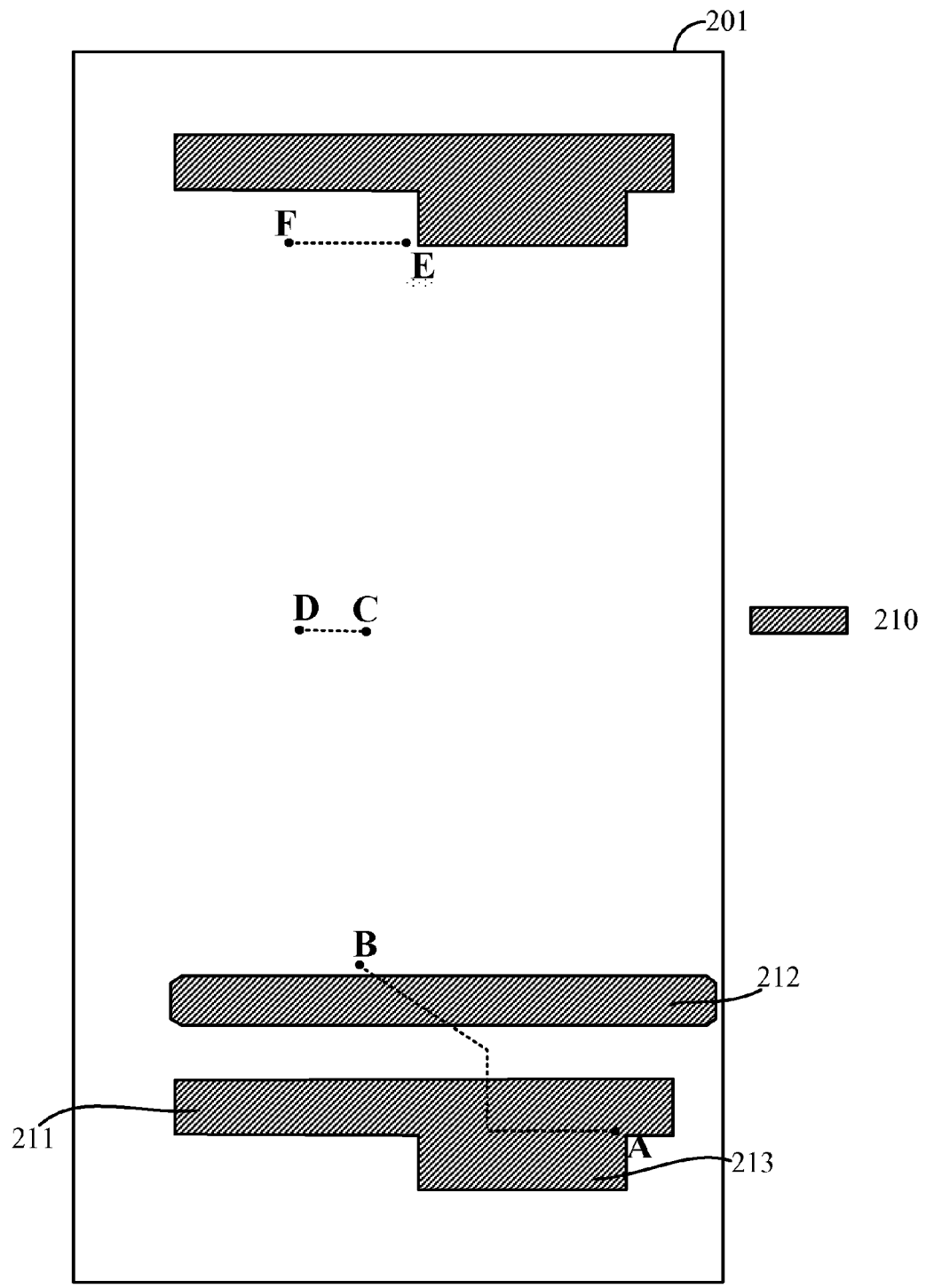
FIG. 2A is a schematic diagram showing a step of forming a patterned first metal layer in a method for manufacturing a pixel structure according to the present invention.
Figure 2B:
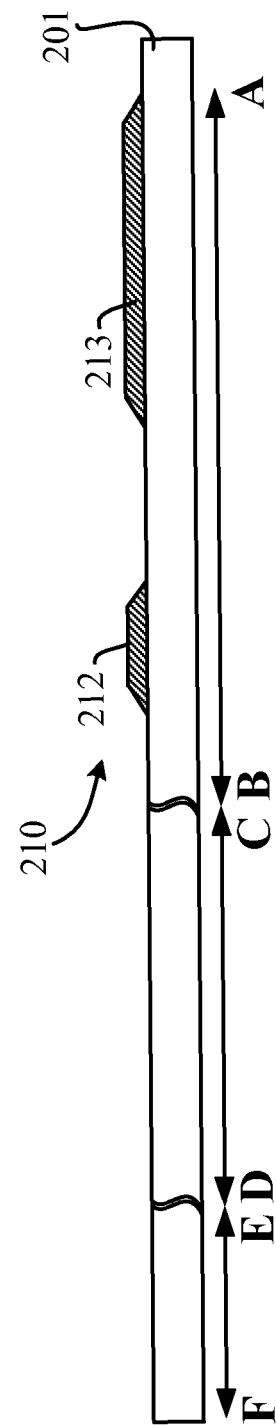
FIG. 2B is a cross-sectional view taken along A-B, C-D, and E-F of FIG. 2A.

Referring to FIG. 2A and FIG. 2B, a patterned first metal layer 210 is formed on a substrate 201 by utilizing a first photolithographic etching process (PEP). The patterned first metal layer 210 comprises a common line 212 and a gate electrode 213. It is noted that the patterned first metal layer 210 also can comprise a gate line 211 in the step of forming the patterned first metal layer 210. The gate electrode 213 belongs to a part of the gate line 211, or a part of the gate line 211 is utilized as the gate electrode 213. The gate line 211 and the gate electrode 213 substantially are electrically connected. The gate line 211, the common line 212, and the gate electrode 213 are made of the same material and are formed in the same manufacturing step. Specifically, in the step of forming the patterned first metal layer 210, a first metal layer is deposited on the substrate 201 and then a first patterned photoresist layer (not shown) is formed on the first metal layer. Next, a first etching process is performed to form the common line 212 and the gate electrode 213 as shown in FIG. 2A and to form the gate line 211 as well. Finally, the first patterned photoresist layer is removed.

Figure 3A:
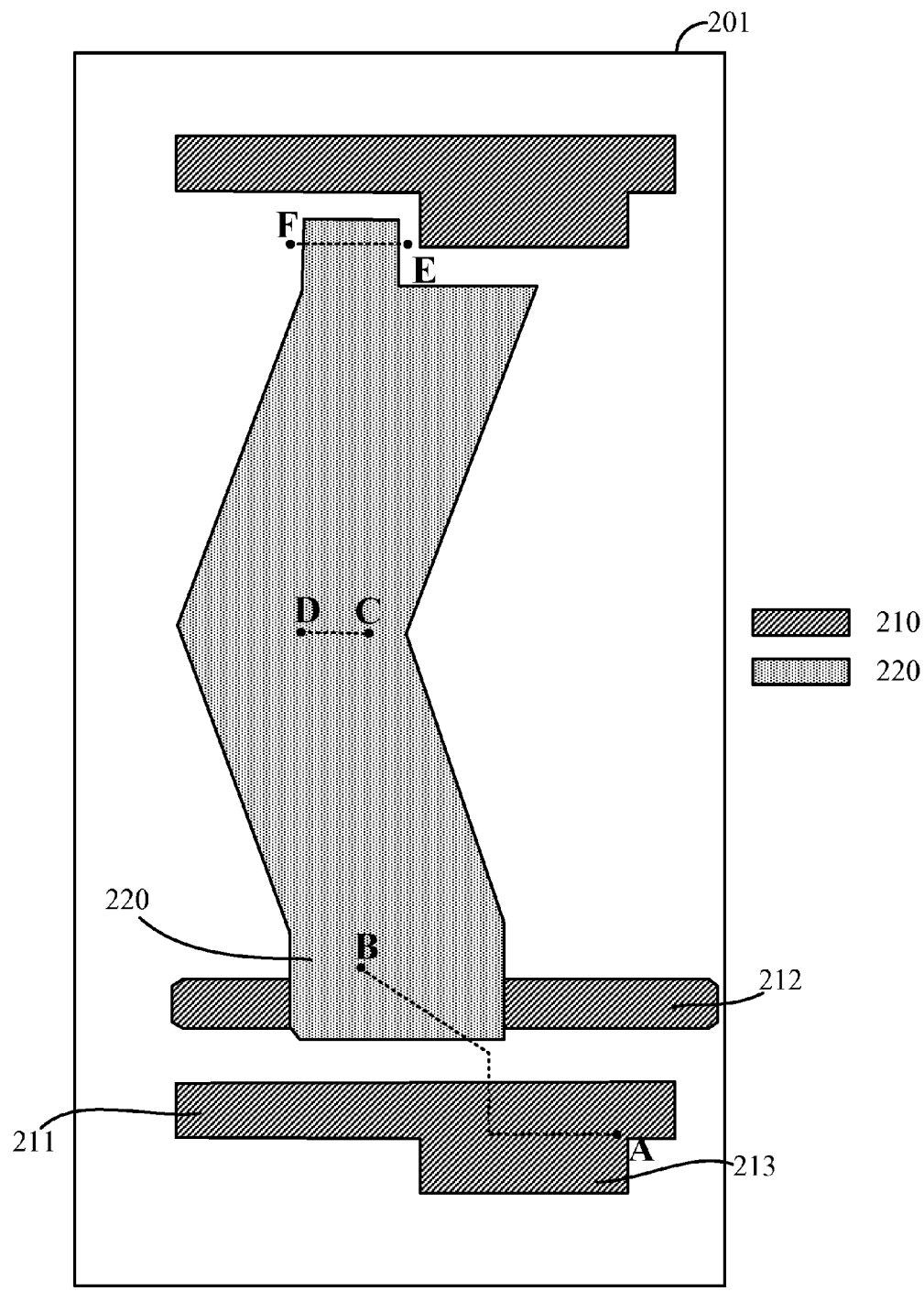
FIG. 3A is a schematic diagram showing a step of forming a patterned first transparent conductive layer in the method for manufacturing the pixel structure according to the present invention.

Referring to FIG. 3A and FIG. 3B, a patterned first transparent conductive layer 220 is formed by utilizing a second photolithographic etching process, wherein a part of the patterned first transparent conductive layer 220 covers the common line 212 for electrically connecting thereto. In the present invention, the patterned first transparent conductive layer 220 is utilized as one electrode of the storage capacitor of the pixel structure and also served as a common electrode in an IPS structure and a FFS structure. This feature will be described later. Specifically, in the step of forming the patterned first transparent conductive layer 220, a first transparent conductive layer such as an indium tin oxide (ITO) is deposited and a second patterned photoresist layer (not shown) is formed on the first transparent conductive layer. Next, a second etching process is performed to form the patterned first transparent conductive layer 220 as shown in FIG. 3A and FIG. 3B. Finally, the second patterned photoresist layer is removed. As shown in FIG. 3A, the common line 212 and a part of the patterned first transparent conductive layer 220 are overlapped and the patterned first transparent conductive layer 220 is extended from a part of the common line 212 to a display area of the pixel structure.

Figure 4A:
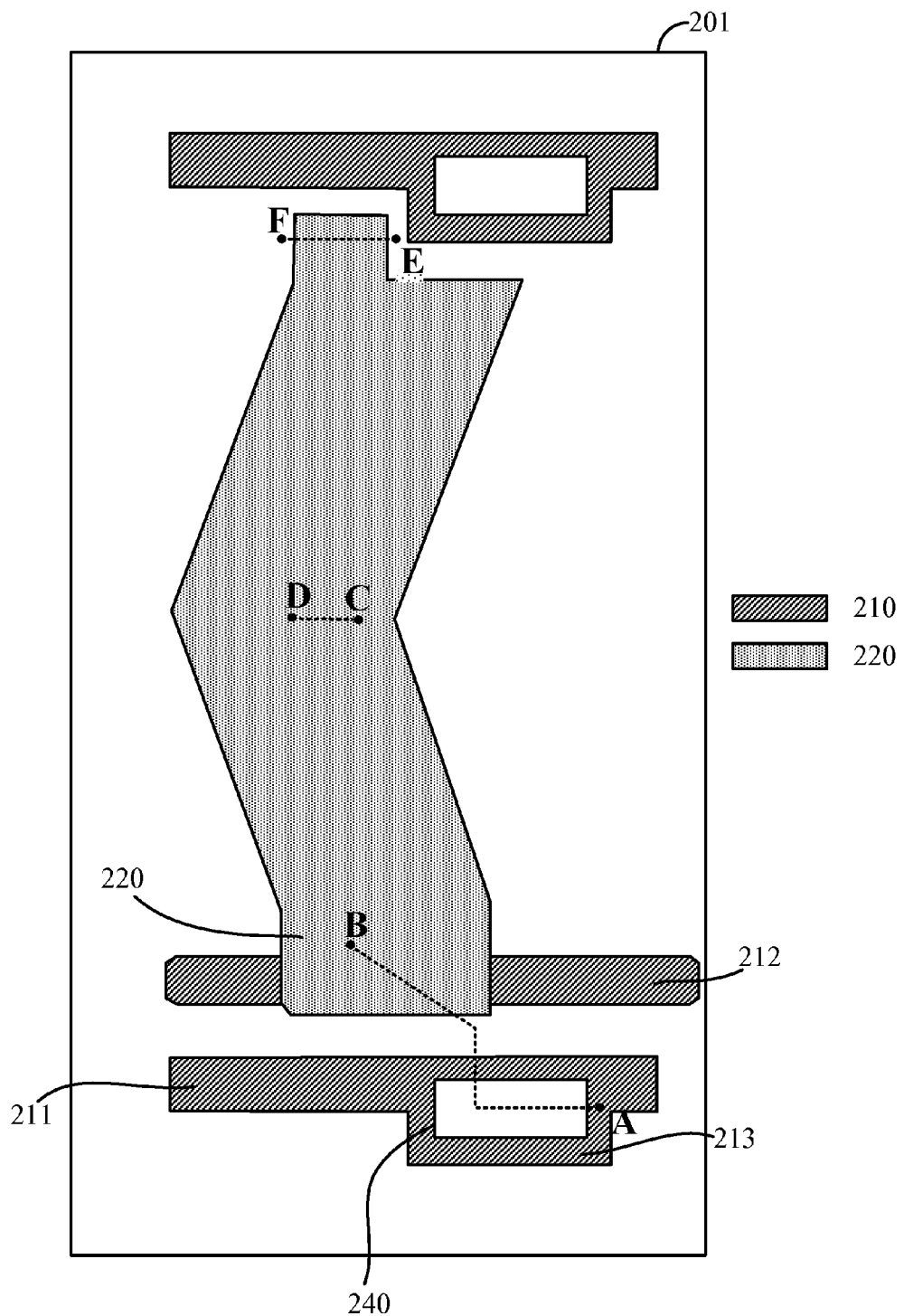
FIG. 4A is a schematic diagram showing a step of forming a patterned semi-conductive layer in the method for manufacturing the pixel structure according to the present invention.
Figure 4B:
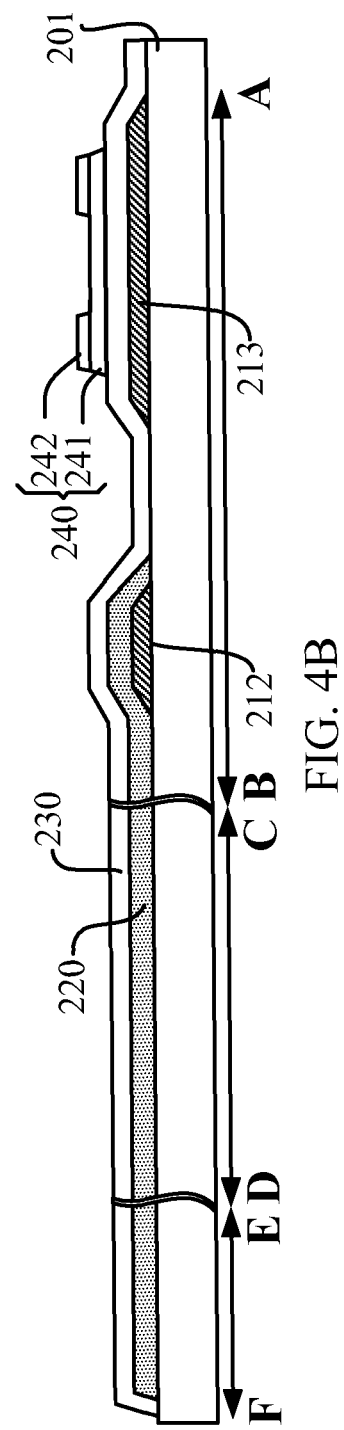
FIG. 4B is a cross-sectional view taken along A-B, C-D, and E-F of FIG. 4A.

Referring to FIG. 4A and FIG. 4B, after forming the patterned first transparent conductive layer 220, an insulating layer 230 is formed to cover the aforesaid patterned first metal layer 210 and the patterned first transparent conductive layer 220 as shown in FIG. 4B. It is noted that the insulating layer 230 is not shown in FIG. 4A. Next, a patterned semi-conductive layer 240 is formed on the first insulating layer 230 above the gate electrode 213 by utilizing a third photolithographic etching process. The patterned semi-conductive layer 240 is also known as an active layer. In one embodiment, the patterned semi-conductive layer 240 comprises a semi-conductive channel layer 241 and an ohmic contact layer 242, as shown in FIG. 4B. In the third photolithographic etching process, a semi-conductive layer may be deposited at first, and then implanted with $N^+$ ions to form the ohmic contact layer 242 on the semi-conductive channel layer 241. Alternatively, a doped semi-conductive material may be directly deposited on the semi-conductive channel layer 241. Thereafter, a third patterned photoresist layer (not shown) is formed on the ohmic contact layer 242. A third etching process is performed to remove some parts but remain the semi-conductive channel layer 241 and the ohmic contact layer 242 that correspond to the gate electrode 213. Finally, the third patterned photoresist layer is removed. The patterned semi-conductive layer 240 is formed therefore.

Figure 5A:
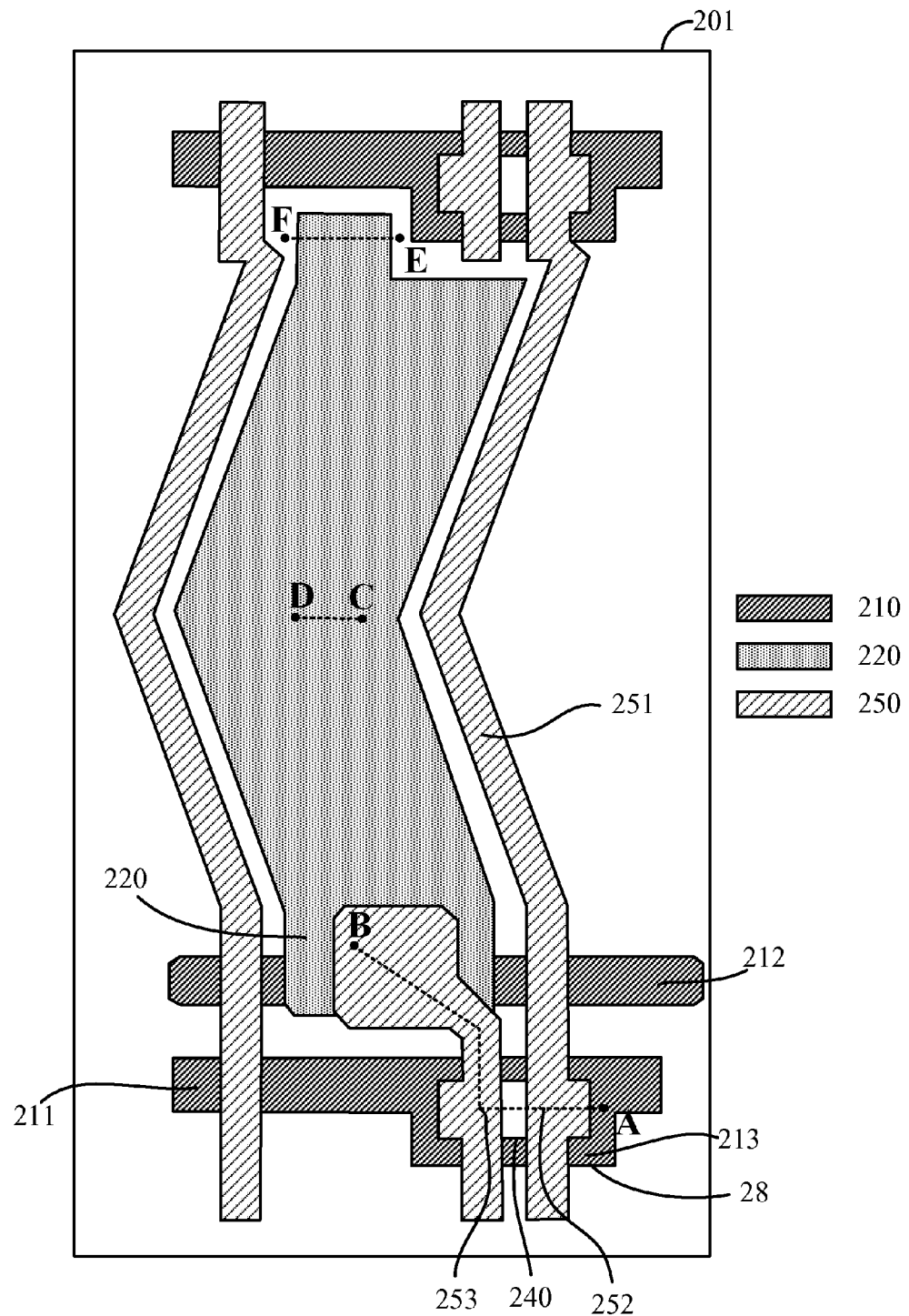
FIG. 5A is a schematic diagram showing a step of forming a patterned second metal layer in the method for manufacturing the pixel structure according to the present invention.
Figure 5B:
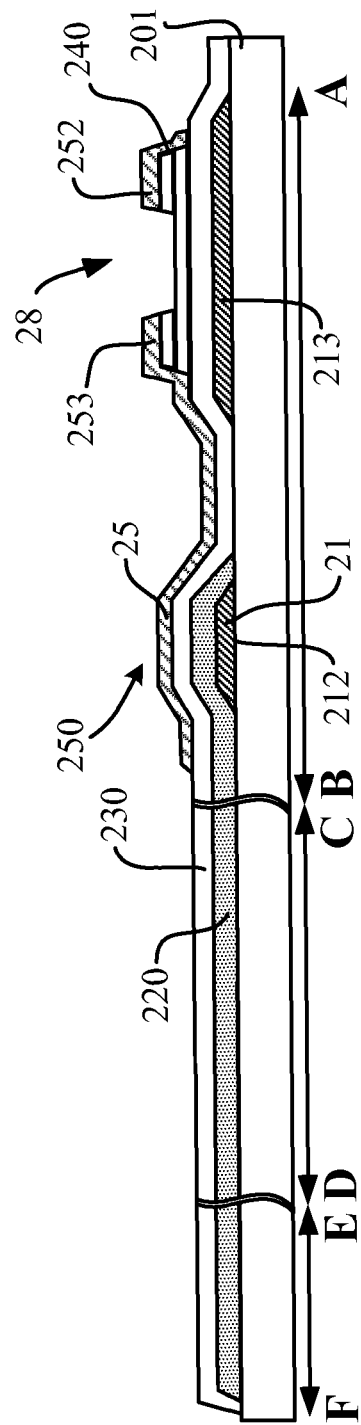
FIG. 5B is a cross-sectional view taken along A-B, C-D, and E-F of FIG. 5A.

Referring to FIG. 5A and FIG. 5B, a fourth photolithographic etching process is utilized in the present invention to form a patterned second metal layer 250. The patterned second metal layer 250 comprises a source electrode 252 and a drain electrode 253 as shown in FIG. 5B. The source electrode 252 and the drain electrode 253 are located individually on the ohmic contact layer 242 of the patterned semi-conductive layer 240. The gate electrode 213, the patterned semi-conductive layer 240, the source electrode 252, and the drain electrode 253 form a thin-film transistor structure 28. It is noted that the patterned second metal layer 250 also can comprise a data line 251 (as shown in FIG. 5A) in the step of forming the patterned second metal layer 250. The source electrode 252 belongs to a part of the data line 251, or a part of the data line 251 is utilized as the source electrode 252. The data line 251 and the source electrode 252 substantially are electrically connected. The data line 251 and the source electrode 252 are made of the same material and are formed in the same manufacturing step. In one embodiment, during the step of forming the patterned second metal layer 250, the patterned second metal layer 250 is also extended from the drain electrode 253 to partial areas above the common line 212 along a surface of the first insulating layer 230 so as to form a top electrode 25. A part of the common line 212 is served as a bottom electrode 21. The top electrode 25 and the bottom electrode 21 are insulated and form a storage capacitor as shown in FIG. 5A. This will be described later. Specifically, in the step of forming the patterned second metal layer 250, a second metal layer is deposited at first and then a fourth patterned photoresist layer (not shown) is formed on the second metal layer. Next, a fourth etching process is performed to remove parts of the second metal layer and to form the source electrode 252 and the drain electrode 253 on partial areas of the ohmic contact layer 242, and the data line 251 and the top electrode 25 are formed as well. Finally, the fourth patterned photoresist layer is removed.

Figure 6A:
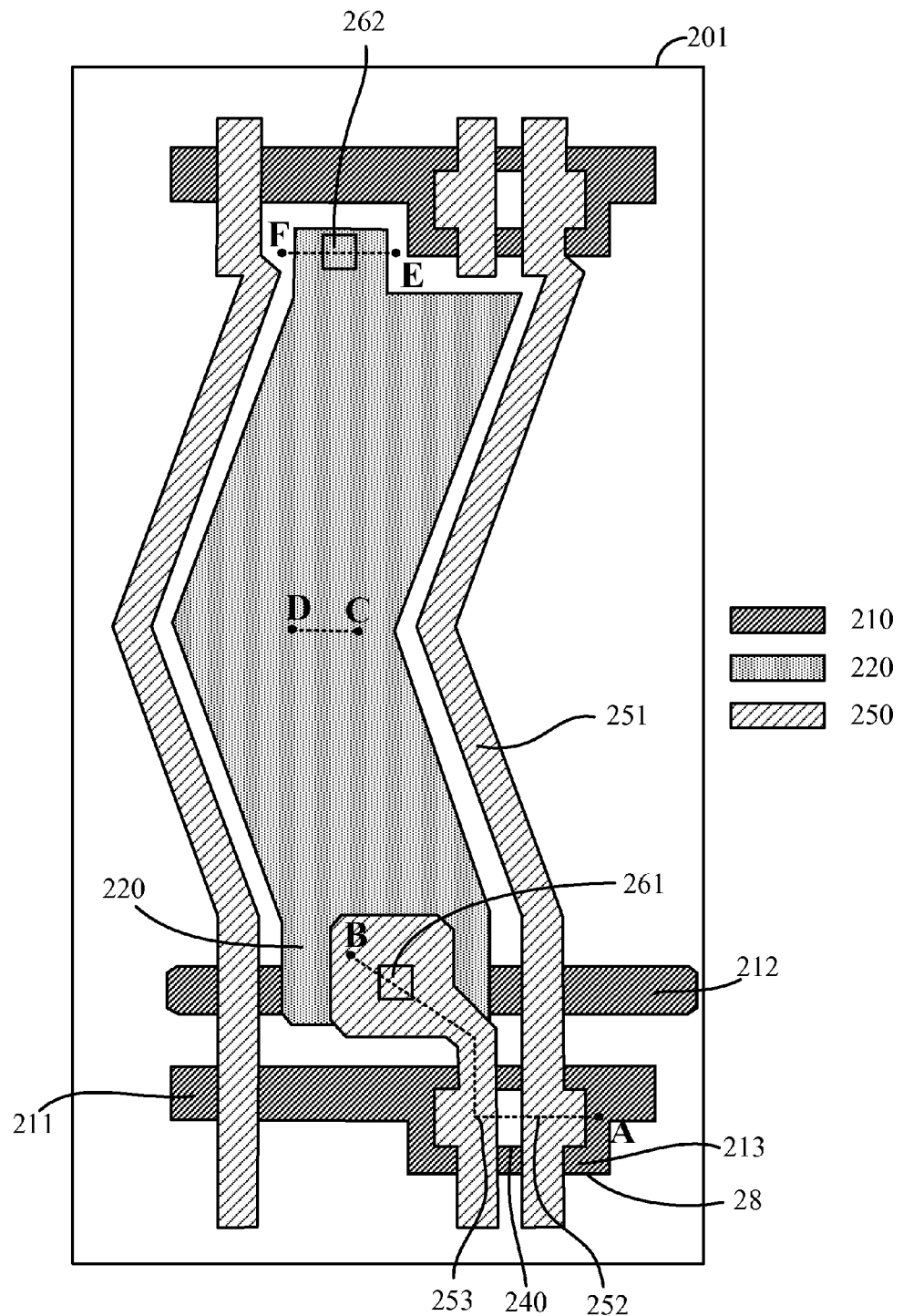
FIG. 6A is a schematic diagram showing a step of patterning a first insulating layer and a second insulating layer in the method for manufacturing the pixel structure according to the present invention.
Figure 6B:
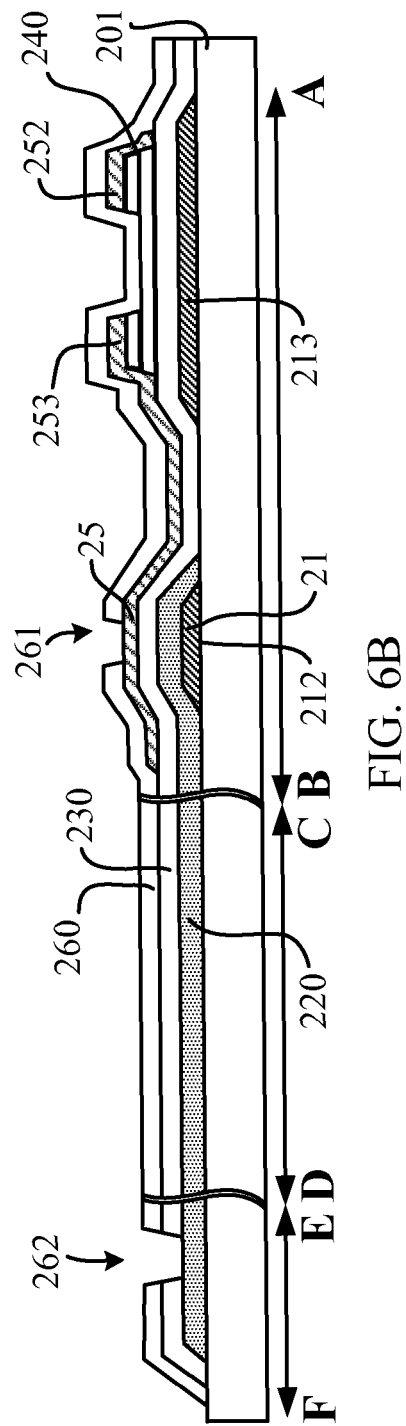
FIG. 6B is a cross-sectional view taken along A-B, C-D, and E-F of FIG. 6A.
Figure 7A:
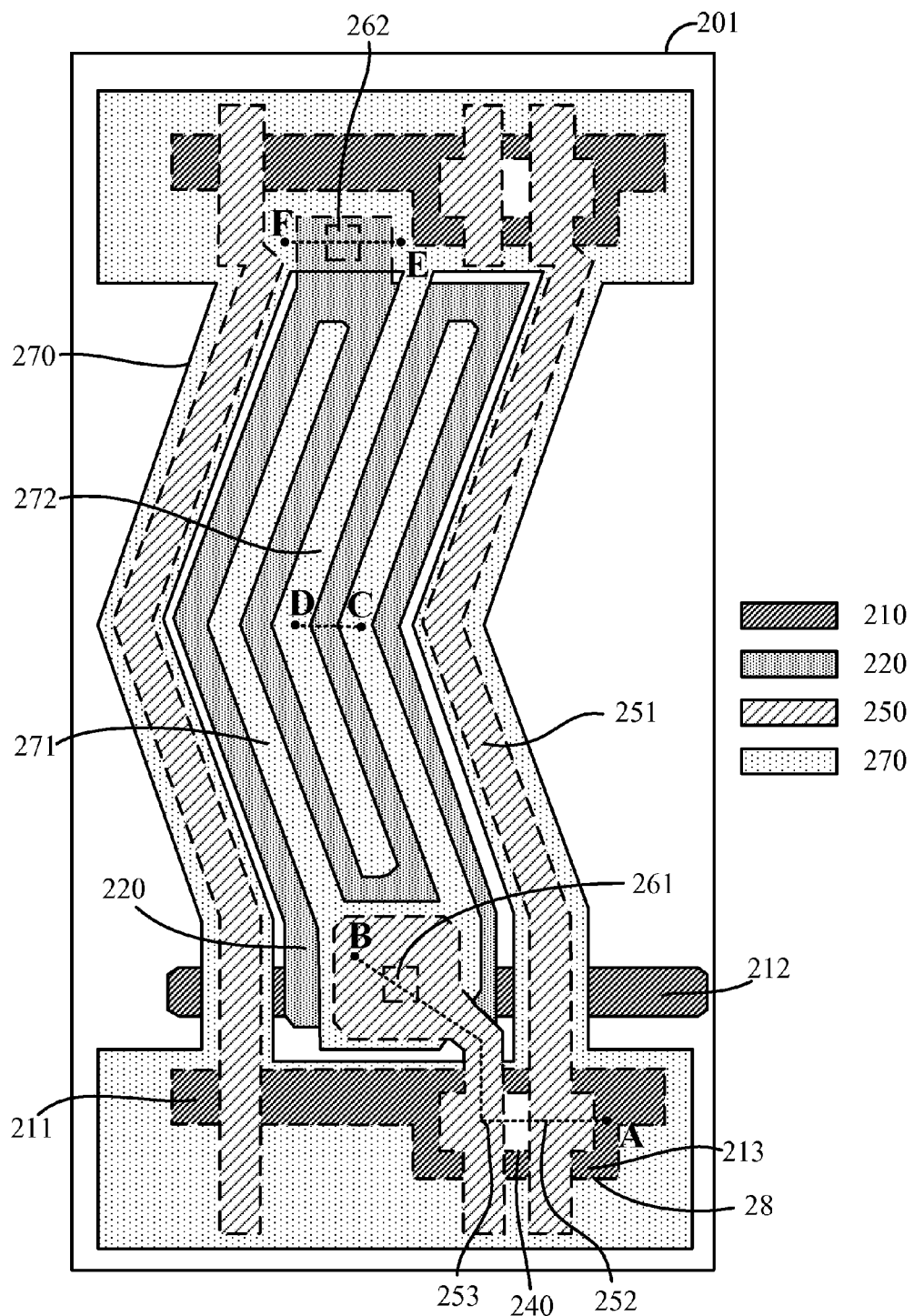
FIG. 7A is a schematic diagram showing a step of forming a patterned second transparent conductive layer in the method for manufacturing the pixel structure according to the present invention.
Figure 7B:
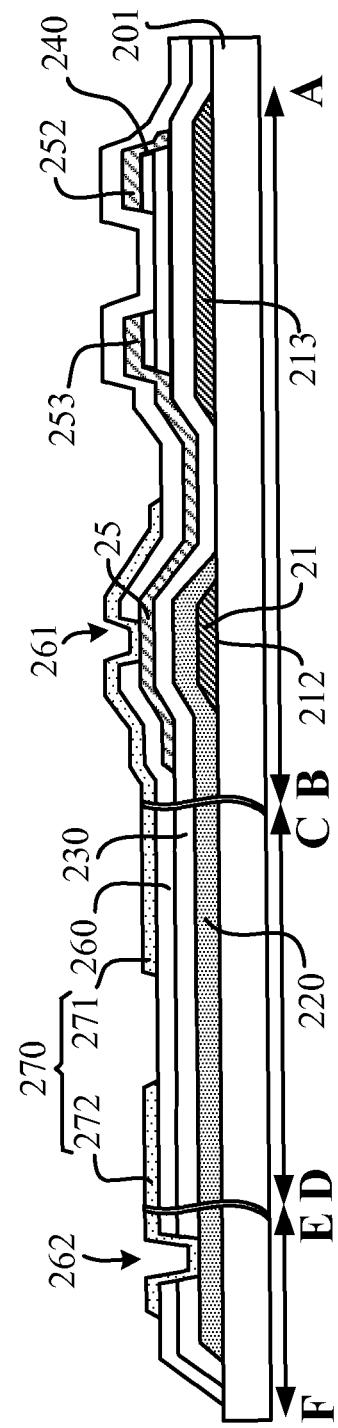
FIG. 7B is a cross-sectional view taken along A-B, C-D, and E-F of FIG. 7A.

Referring to FIG. 6A and FIG. 6B, a second insulating layer 260 is deposited after forming the patterned second metal layer 250. Next, the first insulating layer 230 and the second insulating layer 260 are patterned by utilizing a fifth photolithographic etching process so as to form a first contact hole 261 and a second contact hole 262 as shown in FIG. 6A and FIG. 6B. It is noted that the second insulating layer 262 is not shown in FIG. 6A. Specifically, the step of pattering the first insulating layer 230 and the second insulating layer 260 comprises sub-steps of forming a fifth patterned photoresist layer on the second insulating layer 260; partially removing the first insulating layer 230 and the second insulating layer 260 by performing a fifth etching process to form the first contact hole 261 which exposes a portion that is electrically connected to the drain electrode 253 in the patterned second metal layer 250, and to form the second contact hole 262 which exposes a part of the patterned first transparent conductive layer 220; and removing the fifth patterned photoresist layer. In one embodiment, the aforesaid portion electrically connected to the drain electrode 253 in the patterned second metal layer 250 is located at partial areas above the common line 212.

Referring to FIG. 7A and FIG. 7B, a sixth photolithographic etching process is utilized in the present invention to form a patterned second transparent conductive layer 270. The patterned second transparent conductive layer 270 comprises a pixel electrode 271 and a common electrode 272. As shown in FIG. 7A and FIG. 7B, the pixel electrode 271 is electrically connected to the drain electrode 253 of the thin-film transistor structure 28 via the first contact hole 261, and the common electrode 272 is electrically connected to the patterned first transparent conductive layer 220 via the second contact hole 262. It is noted that the elements covered by the patterned second transparent conductive layer 270 in FIG. 7A are represented by dash lines. Specifically, during the step of forming the patterned second transparent conductive layer 270, a second transparent conductive layer such as an indium tin oxide is deposited at first and then a sixth patterned photoresist layer (not shown) is formed on the second transparent conductive layer. Next, a sixth etching process is performed to form the pixel electrode 271 and the common electrode 272. Finally, the sixth patterned photoresist layer is removed.

As shown in FIG. 7A, the common electrode 272 has a U-shaped slit and the pixel electrode 271 has a U-shaped structure. Legs of the U-shaped structure are extended to the display area of the pixel structure, and are located in the U-shaped slit of the common electrode 272. In another embodiment, the common electrode 272 also can have another type of slit, and the pixel electrode 271 can be a shape corresponding to the type of slit.

As described above, the common electrode 272 of the patterned second transparent conductive layer 270 is electrically connected to the patterned first transparent conductive layer 220, and therefore a voltage level of the patterned first transparent conductive layer 220 is identical to that of the common electrode 272. The patterned first transparent conductive layer 220 can be served as another common electrode. In the present invention, the arrangement of the pixel electrode 271 and the common electrode 272 is similar to that in the IPS structure, which can run an electric field horizontally through the material. The arrangement of the pixel electrode 271 and said another common electrode is similar to that in the FFS structure, which can form a fringe electric field. Therefore, the present invention pertains to a hybrid pixel structure combing the IPS technique and the FFS technique. Moreover, the patterned first transparent conductive layer 220 and the pixel electrode 271 of the patterned second transparent conductive layer 270 are insulated and form the storage capacitor in the pixel structure of the present invention. Since the storage capacitor of the pixel structure of the present invention is constructed by the two transparent conductive layers, an aperture ratio of a display panel is not affected by forming the storage capacitor in the present invention as compared to form the storage capacitor by two metal layers in conventional skills. Therefore, the present invention can reduce a feedthrough voltage efficiently and thus prevent a screen from blinking, without decreasing the aperture ratio. In another aspect, the bottom electrode 21 formed by a part of the common line 212 and the top electrode 25 formed by partial areas of the patterned second metal layer 250 corresponding to the common line 212 also form a capacitor. The capacitance of said capacitor also contributes to the aforesaid storage capacitor as well in the present invention.

Figure 8A:
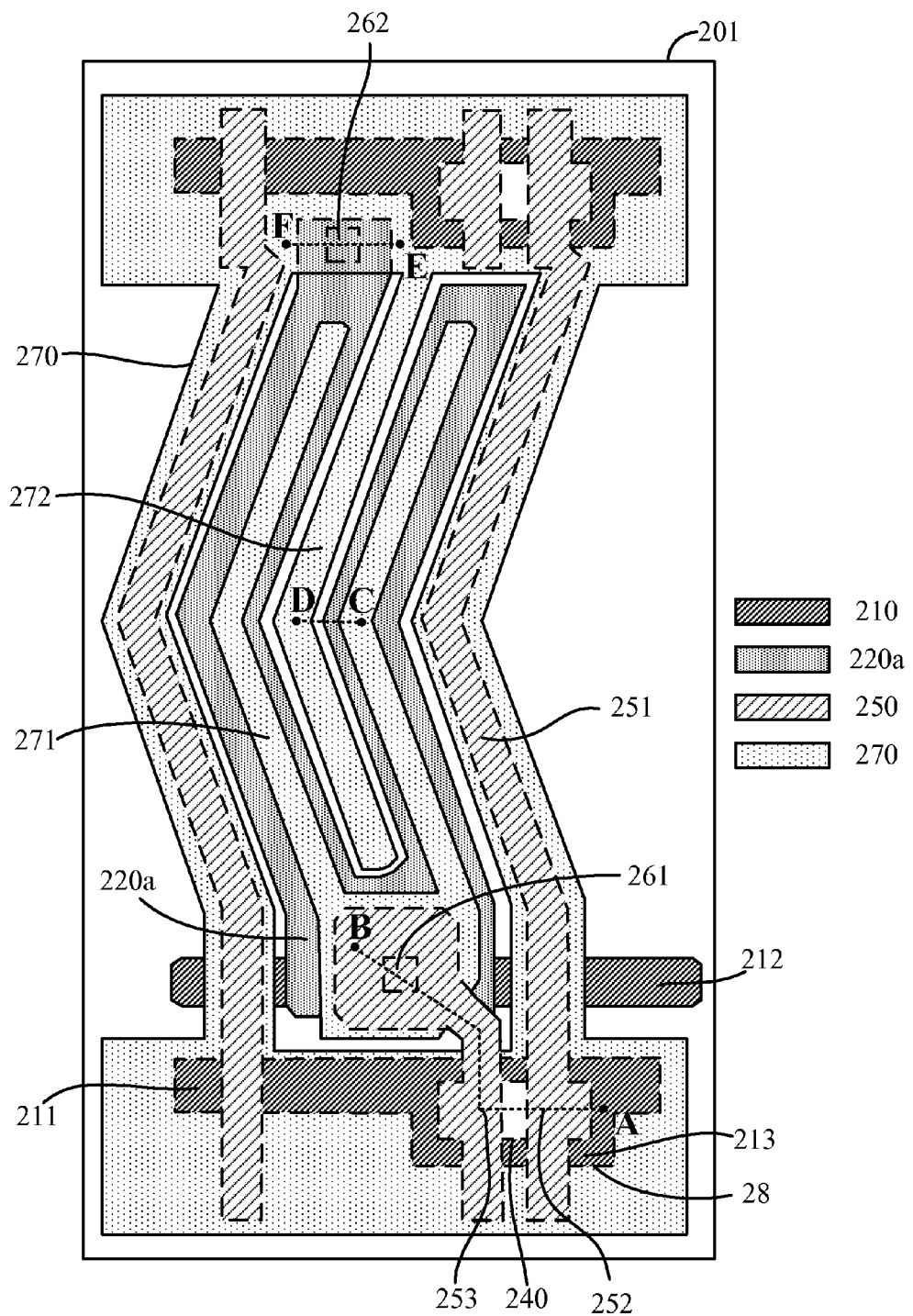
FIG. 8A is a top view of a pixel structure according to another preferred embodiment of the present invention.
Figure 8B:
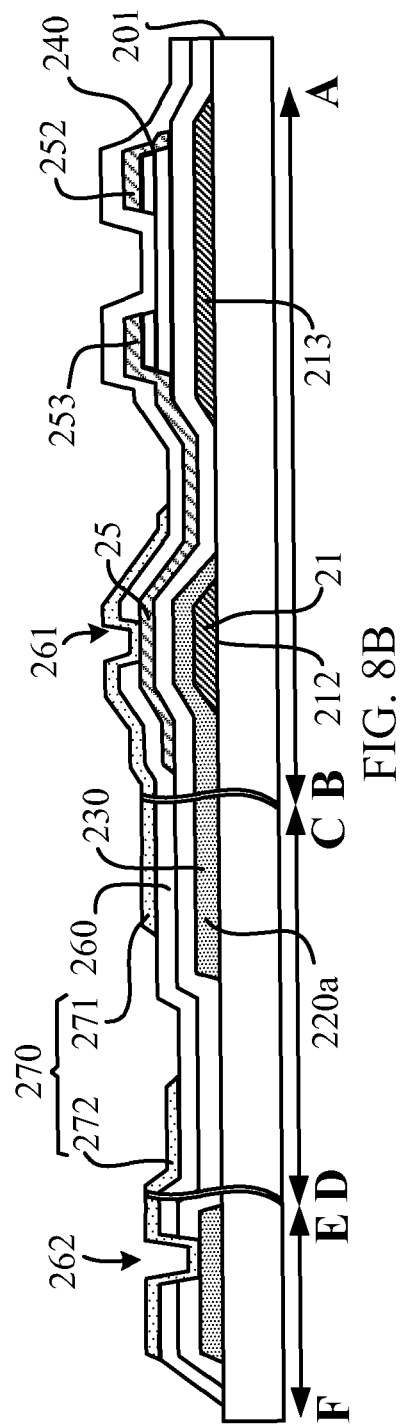
FIG. 8B is a cross-sectional view of the pixel structure shown in FIG. 8A.
Figure 8C:
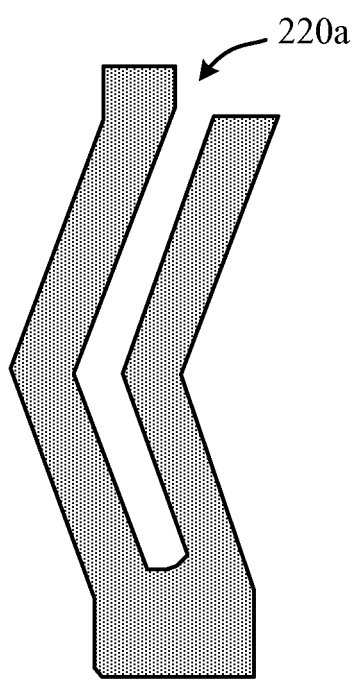
FIG. 8C is a schematic diagram showing a patterned first transparent conductive layer shown in FIG. 8A.

In another preferred embodiment of the present invention, a patterned first transparent conductive layer 220a shown in FIG. 8C can be formed in the step of forming the patterned first transparent conductive layer by using the second photolithographic etching process. The patterned first transparent conductive layer 220a has a hollow portion corresponding to the common electrode 272 of the patterned second transparent conductive layer 270. The hollow portion is utilized for increasing transparence. Besides, other manufacturing steps are similar to those shown in FIGS. 2, and 4-7, and are omitted herein. The top view and cross-sectional view of the pixel structure of said another preferred embodiment of the present invention are respectively shown in FIG. 8A and FIG. 8B.

Referring to FIG. 7A and FIG. 7B, the pixel structure of the present invention has a gate line 211 and a data line 251 interlaced therebetween. The pixel structure is defined by the gate line 211 and the data line 251. The pixel structure comprises a common line 212, a patterned first transparent conductive layer 220, a patterned second transparent conductive layer 270, and at least an insulating layer 230, 260, and a thin-film transistor structure 28. All these elements are disposed on the same substrate 201. The gate line 221 provides scan signals, the data line provides pixel data, and the common line 212 provides a common voltage. It is noted that the elements covered by the patterned second transparent conductive layer 270 are represented by dash lines as shown in FIG. 7A.

The patterned first transparent conductive layer 220 is extended to a display are of the pixel structure so as to form a first common electrode. The first common electrode is electrically connected to the common line 212. In one embodiment, the common line 212 and a part of the patterned first transparent conductive layer 220 are directly overlapped such that the first common electrode is electrically connected to the common line 212. The patterned second transparent conductive layer 270 is located above the patterned first transparent conductive layer 220. The patterned first transparent conductive layer 220 and the patterned second transparent conductive layer 270 have at least the insulating layer 230, 260 disposed therebetween. The patterned second transparent conductive layer 270 forms a pixel electrode 271 and a second common electrode 272. As shown in FIG. 7A, the second common electrode 272 has a plurality of slits, the pixel electrode 271 has a U-shaped structure, and legs of the U-shaped structure are extended to the display area of the pixel structure and located in the slits of the second common electrode 272.

The thin-film transistor structure 28 comprises a gate electrode 213, a source electrode 252, and a drain electrode 253. The gate electrode 213 is electrically connected to the gate line 221. The source electrode 253 is electrically connected to the data line 251. The pixel electrode 271 of the patterned second transparent conductive layer 270 is electrically connected to the drain electrode 253 of the thin-film transistor structure 28. In one embodiment, the pixel electrode 271 of the patterned second transparent conductive layer 270 is electrically connected to the drain electrode 253 of the thin-film transistor structure 28 via a first contact hole 261. The first common electrode of the patterned first transparent conductive layer 220 is electrically connected to the second common electrode 272 of the patterned second transparent conductive layer 270. That is, the first common electrode and the second common electrode 272 have the same voltage level. In one embodiment, the second common electrode 272 of the patterned first transparent conductive layer 270 is electrically connected to the first common electrode of the patterned first transparent conductive layer 220 via a second contact hole 262.

In the present invention, electric fields formed respectively between the pixel electrode 271 of the patterned second transparent conductive layer 270 and the first common electrode and between the pixel electrode 271 and the second common electrode 272 make liquid crystal molecules twisted. In detail, the arrangement of the pixel electrode 271 and the second common electrode 272 of the patterned second transparent conductive layer 270 is similar to that in the IPS structure, which can run an electric field horizontally through the material. The arrangement of the pixel electrode 271 of the patterned second transparent conductive layer 270 and the first common electrode of the patterned first transparent conductive layer 220 is similar to that in the FFS structure, which can form a fringe electric field. Therefore, the present invention pertains to a hybrid pixel structure combing the IPS technique and the FFS technique, and has advantages of wide viewing angle, low energy consumption, and low color deviation.

Figure 1:
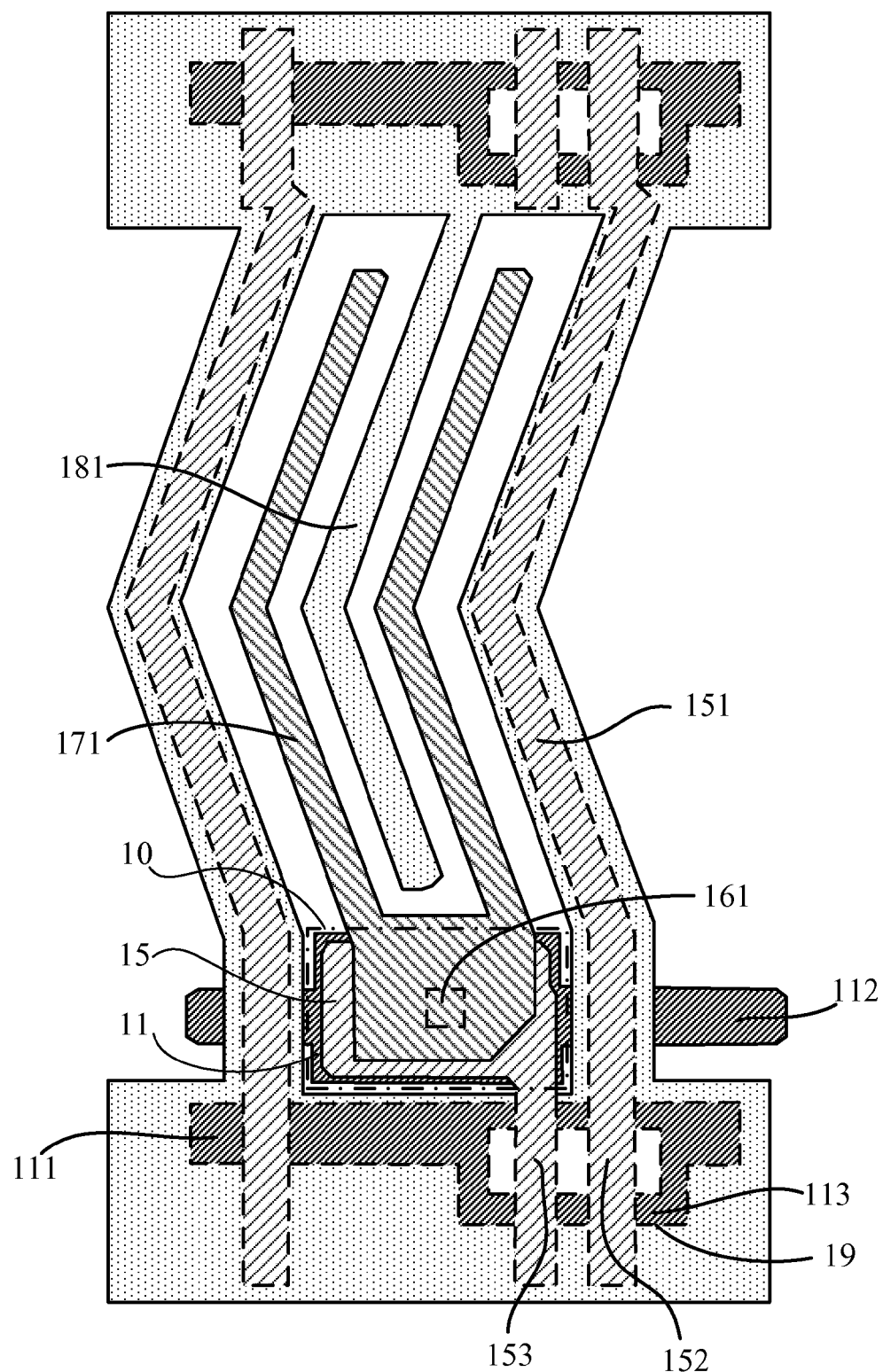
FIG. 1 is top view of a conventional pixel structure.

Moreover, as described above, the patterned first transparent conductive layer 220 and the patterned second transparent conductive layer 270 have at least the insulating layer 230, 260 disposed therebetween. The pixel electrode 271 and the first common electrode are insulated and form a first storage capacitor in the pixel structure of the present invention. In addition, the pixel structure of the present invention further comprises a metal layer which is extended from the drain electrode 253 of the thin-film transistor structure 28 to partial areas above the common line 212 to form a top electrode 25. A part of the common line 212 forms a bottom electrode 21. The top electrode 25 and the bottom electrode 21 form a second storage capacitor in the pixel structure of the present invention. The effective capacitance of storage capacitor of the pixel structure of the present invention is obtained by adding the capacitances of the first storage capacitor and the second storage capacitor. As compared to forming the storage capacitor by two metal layers in conventional skills, the present invention can improve an aperture ratio of a display panel by reducing the areas occupied by the two metal layers. The decreased capacitance due to reducing the areas occupied by the two metal layers is compensated by the capacitor formed by the two transparent conductive layers in the present invention. For example, for the same feedthrough voltage and the same effective capacitance 121 fF, a conventional pixel structure shown in FIG. 1 has an aperture ratio of 36.75% and the pixel structure of the present invention shown in FIG. 7A and FIG. 7B has an aperture ratio of 41.02%. The difference between the aforesaid two aperture ratios is about 10%. As can be seen, the pixel structure of the present invention can improve the aperture ratio efficiently without decreasing the storage capacitor.

About all, the storage capacitor is formed by two metal layers in conventional skills. When a feedthrough voltage is increased, a larger storage capacitor is required to prevent a screen from blinking. Conventionally, it needs to increase the areas occupied by the two metal layers to obtain a larger storage capacitor. However, this will reduce an aperture ratio of a display panel. The storage capacitor of the pixel structure of the present invention is formed by two transparent conductive layers. In this manner, the capacitance of the storage capacitor can be increased without reducing the aperture ratio. The feedthrough voltage will be decreased due to the increased storage capacitor, and thereby reducing the probability of screen blinking.

In addition, in one embodiment, the common line 212, the gate line 211, and the gate electrode 213 of the thin-film transistor 28 can be formed in the same manufacturing step, and therefore the common line 212, the gate line 211, and the gate electrode 213 are located at the same layer. In one embodiment, the gate electrode 213 and the gate line 211 can be formed in the same manufacturing step, and the source electrode 252 and the data line 251 can be formed in another manufacturing step, and therefore the gate electrode 213 and the gate line 211 are located at the same layer and both of the source electrode 252 and the data line 251 belong to another layer. In another embodiment, the thin-film transistor structure 28 further comprises a patterned semi-conductive layer 240. As described above, the patterned semi-conductive layer 240 comprises a semi-conductive channel layer 241 and an ohmic contact layer 242.

In another preferred embodiment of the present invention, a patterned first transparent conductive layer 220a shown in FIG. 8C can be served as the first common electrode. The patterned first transparent conductive layer 220a has a hollow portion corresponding to the second common electrode 272 of the patterned second transparent conductive layer 270. The hollow portion is utilized for increasing transparence. The top view and cross-sectional view of the pixel structure of said another preferred embodiment of the present invention are respectively shown in FIG. 8A and FIG. 8B.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A method for manufacturing a pixel structure, comprising steps of:
    forming a patterned first metal layer on a substrate, the patterned first metal layer comprising a common line and a gate electrode;
    forming a patterned first transparent conductive layer, of which a part covers the common line for electrically connecting thereto, wherein the patterned first transparent conductive layer has a first common electrode;
    forming a first insulating layer to cover the patterned first metal layer and the patterned first transparent conductive layer;
    forming a patterned semi-conductive layer on the first insulating layer above the gate electrode;
    forming a patterned second metal layer, the patterned second metal layer comprising a source electrode and a drain electrode;
    forming a second insulating layer;
    patterning the first insulating layer and the second insulating layer to form a first contact hole and a second contact hole; and
    forming a patterned second transparent conductive layer which comprises a pixel electrode and a common electrode, wherein the patterned second transparent conductive layer has a second common electrode;
    wherein the first common electrode of the patterned first transparent conductive layer has a hollow portion which corresponds to the second common electrode of the patterned second transparent conductive layer.

2. The method according to claim 1, wherein the step of forming the patterned first metal layer comprises sub-steps of:
    depositing a first metal layer on the substrate;
    forming a first patterned photoresist layer on the first metal layer;
    forming the common line and the gate electrode by performing a first etching process; and
    removing the first patterned photoresist layer.

3. The method according to claim 1, wherein in the step of forming the patterned first metal layer, the patterned first metal layer further comprises a gate line and a part of the gate line is utilized as the gate electrode.

4. The method according to claim 1, wherein the step of forming the patterned first transparent conductive layer comprises sub-steps of:
    depositing a first transparent conductive layer;
    forming a second patterned photoresist layer on the first transparent conductive layer;
    forming the patterned first transparent conductive layer by performing a second etching process, wherein the common line and a part of the patterned first transparent conductive layer are overlapped; and
    removing the second patterned photoresist layer.

5. The method according to claim 1, wherein the step of forming the patterned semi-conductive layer comprises sub-steps of:
    depositing a semi-conductive layer;
    forming a third patterned photoresist layer on the semi-conductive layer; and
    forming the patterned semi-conductive layer on the first insulating layer above the gate electrode by performing a third etching process.

6. The method according to claim 1, wherein the step of forming the patterned second metal layer comprises sub-steps of:
    depositing a second metal layer;
    forming a fourth patterned photoresist layer on the second metal layer;
    partially removing the second metal layer by performing a fourth etching process to form the source electrode and the drain electrode on some regions of the patterned semi-conductive layer; and
    removing the fourth patterned photoresist layer.

7. The method according to claim 1, wherein in the step of forming the patterned second metal layer, the patterned second metal layer further comprises a data line and the data line is electrically connected to the source electrode.

8. The method according to claim 1, wherein in the step of forming the patterned second metal layer, the patterned second metal layer further is extended from the drain electrode to partial areas above the common line, along a surface of the first insulating layer.

9. The method according to claim 1, wherein the step of patterning the first insulating layer and the second insulating layer comprises sub-steps of:
    forming a fifth patterned photoresist layer on the second insulating layer;
    partially removing the first insulating layer and the second insulating layer by performing a fifth etching process to form the first contact hole which exposes a portion that is electrically connected to the drain electrode in the patterned second metal layer, and to form the second contact hole which exposes a part of the patterned first transparent conductive layer; and
    removing the fifth patterned photoresist layer.

10. The method according to claim 1, wherein the step of forming the patterned second transparent conductive layer comprises sub-steps of:
    depositing a second transparent conductive layer;
    forming a sixth patterned photoresist layer on the second transparent conductive layer;
    forming the pixel electrode and the common electrode by performing a sixth etching process, wherein the common electrode has a U-shaped slit, the pixel electrode has a U-shaped structure, and legs of the U-shaped structure are extended to a display area of the pixel structure and located in the U-shaped slit of the common electrode; and
    removing the sixth patterned photoresist layer.

11. A pixel structure, which is defined by a gate line and a data line, the pixel structure comprises:
    a common line disposed on a substrate;
    a patterned first transparent conductive layer electrically connected to the common line, the patterned first transparent conductive layer has a first common electrode;
    a patterned second transparent conductive layer located above the patterned first transparent conductive layer, the patterned second transparent conductive layer has a pixel electrode, and a second common electrode;
    at least an insulating layer disposed between the patterned first transparent conductive layer and the patterned second transparent conductive layer; and a thin-film transistor structure disposed on the substrate and comprising a gate electrode, a source electrode, and a drain electrode;

wherein the second common electrode is electrically connected to the first common electrode, and the pixel electrode and the first common electrode forms a storage capacitor;

wherein the first common electrode of the patterned first transparent conductive layer has a hollow portion which corresponds to the second common electrode of the patterned second transparent conductive layer.

12. The pixel structure according to claim 11, further comprises a metal layer which is extended from the drain electrode of the thin-film transistor structure to partial areas above the common line for forming a top electrode, wherein a part of the common line forms a bottom electrode, and the top electrode and the bottom electrode form another storage capacitor.

13. The pixel structure according to claim 11, wherein the common line and the gate electrode of the thin-film transistor structure are located at the same layer.

14. The pixel structure according to claim 11, wherein the common line and a part of the patterned first transparent conductive layer are directly overlapped.

15. The pixel structure according to claim 11, wherein the gate electrode and the gate line are located at the same layer, and both of the source electrode and the data line belong to another layer.

16. The pixel structure according to claim 11, wherein the pixel electrode of the patterned second transparent conductive layer is electrically connected to the drain electrode of the thin-film transistor structure via a first contact hole.

17. The pixel structure according to claim 11, wherein the second common electrode of the patterned second transparent conductive layer is electrically connected to the first common electrode of the patterned first transparent conductive layer via a second contact hole.

18. The pixel structure according to claim 11, wherein the second common electrode has a U-shaped slit, the pixel electrode has a U-shaped structure, and legs of the U-shaped structure are extended to the display area of the pixel structure and located in the U-shaped slit of the second common electrode.

19. The pixel structure according to claim 11, wherein the thin-film transistor structure further comprises a semi-conductive layer which comprises a semi-conductive channel layer and an ohmic contact layer.

* * * * *